(12) United States Patent
Isawa et al.

(10) Patent No.: US 10,854,420 B2
(45) Date of Patent: Dec. 1, 2020

(54) PATTERN EVALUATION DEVICE

(71) Applicant: HITACHI HIGH-TECHNOLOGIES CORPORATION, Tokyo (JP)

(72) Inventors: Miki Isawa, Tokyo (JP); Ayumi Doi, Tokyo (JP); Kazuhisa Hasumi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 49 days.

(21) Appl. No.: 16/310,830

(22) PCT Filed: Jul. 22, 2016

(86) PCT No.: PCT/JP2016/071478
§ 371 (c)(1),
(2) Date: Dec. 18, 2018

(87) PCT Pub. No.: WO2018/016062
PCT Pub. Date: Jan. 25, 2018

(65) Prior Publication Data
US 2020/0098543 A1   Mar. 26, 2020

(51) Int. Cl.
*H01J 37/28* (2006.01)
*H01J 37/22* (2006.01)
(Continued)

(52) U.S. Cl.
CPC .......... *H01J 37/28* (2013.01); *G01N 23/2251* (2013.01); *G06T 7/001* (2013.01);
(Continued)

(58) Field of Classification Search
CPC .................... H01J 37/28; H01J 37/222; H01J 2237/24578; H01J 2237/2817;
(Continued)

(56) References Cited

U.S. PATENT DOCUMENTS

| 7,615,746 B2 | 11/2009 | Nagatomo et al. |
| 2006/0126916 A1* | 6/2006 | Kokumai ............... G03F 9/7076 382/151 |
| 2018/0211376 A1* | 7/2018 | Bedell ................... G06K 9/4604 |

FOREIGN PATENT DOCUMENTS

| JP | 2007-147366 A | 6/2007 |
| JP | 2012-243831 A | 12/2012 |
| JP | 2015-021805 B2 | 2/2015 |

OTHER PUBLICATIONS

Narender Rana, et al. "Bridging CD metrology gaps of advanced patterning with assistance of nanomolding", Proc. of SPIE, vol. 8324, SPIE 2012.

(Continued)

*Primary Examiner* — Nicole M Ippolito
(74) *Attorney, Agent, or Firm* — Mattingly & Malur, PC

(57) ABSTRACT

A pattern evaluation device has measurement or inspection conditions, supplied for the measurement and inspection of a replica produced by transferring a pattern for a semiconductor wafer or the like, which can be easily set, and with which recipes can be easily generated, when measurement and inspection conditions for the semiconductor wafer or the like and recipes in which these conditions are stored have been prepared in advance. The pattern evaluation device in which a pattern formed on the semiconductor wafer is evaluated on the basis of image data or signal waveforms obtained on the basis of beam irradiation or probe scanning of the semiconductor wafer, wherein the device conditions for evaluating the semiconductor wafer are converted to device conditions for evaluating a replica obtained by transferring a part of a pattern of the semiconductor wafer, and the converted device conditions are used to evaluate the replica.

6 Claims, 8 Drawing Sheets

(51) Int. Cl.
*G01N 23/2251* (2018.01)
*G06T 7/00* (2017.01)

(52) U.S. Cl.
CPC ... *H01J 37/222* (2013.01); *H01J 2237/24578* (2013.01); *H01J 2237/2817* (2013.01)

(58) Field of Classification Search
CPC ........ G01N 23/2251; G01N 2223/6116; G06T 7/001; G06T 2207/10061; G06T 2207/30148
USPC .......................... 250/306, 307, 309, 310, 311
See application file for complete search history.

(56) References Cited

OTHER PUBLICATIONS

International Search Report of PCT/JP2016/071478 dated Nov. 1, 2016.

\* cited by examiner (a)        (b)

PATTERN EVALUATION DEVICE

TECHNICAL FIELD

The present disclosure relates to a pattern evaluation device generated by a semiconductor manufacturing process or the like, and particularly to a pattern evaluation device which evaluates the shape of a pattern after transferring a fine pattern onto resin.

BACKGROUND ART

Nowadays, with the integration and lamination of semiconductor patterns, three-dimensional shape measurement of a pattern becomes more and more important for performance evaluation of the pattern in a manufacturing process or a research and development process of semiconductor devices. In the related art, it is difficult for an electron microscope which is used as a pattern measurement device to obtain information of a bottom portion of a fine pattern which has a high aspect ratio, so that the device is not suitable for three-dimensional shape measurement of such patterns. Therefore, Nonpatent Literature 1 proposes a technique which facilitates evaluation by preparing a replica where a semiconductor pattern is transferred to resin and inverting concave shapes into convex shapes has been proposed.

Patent Literature 1 proposes a replica collection device for automatically collecting a replica from a pattern to be inspected on a semiconductor wafer, and a replica inspection system for automatically inspecting the replica. Meanwhile, in a device which automatically measures and inspects a pattern formed on a sample, a control program (referred to as a recipe) for automatically controlling the measurement and inspection device is prepared in advance, and the measurement and inspection are automatically performed by using the recipe to control. Patent Literature 2 proposes a function of automatically converting a recipe for one sample into a recipe for another sample when different samples, such as a wafer and a mask, which have equivalent patterns formed thereon, are inspected. Patent Literature 3 describes a method in which in order to use photographing recipe information for measuring a sample generated by one manufacturing process to generate a photographing recipe for measuring a sample generated by another manufacturing process, diversified data are correlated using coordinate information, part or all of the diversified data are selected, and a photographing recipe is generated using the selected data.

CITATION LIST

Patent Literature

PTL 1: JP-A-2015-021805
PTL 2: JP-A-2012-243831
PTL 3: JP-A-2007-147366 (corresponding to U.S. Pat. No. 7,615,746)

Nonpatent Literature

Nonpatent Literature 1: Narender Rana, Dario Goldfarb, "Bridging CD metrology gap of advanced patterning with assistance of nanomolding", Proc. Of SPIE, 8324, 83241-M, 2012.

SUMMARY OF INVENTION

Technical Problem

If it is possible to generate a replica as described in Nonpatent Literature 1 or Patent Literature 1 and measure the replica with a scanning electron microscope or the like, evaluation of three-dimensional shape can be easily performed. Meanwhile, a scanning electron microscope for performing pattern measurement or the like is controlled by an operation program called a recipe to enable automatic measurement. In order to efficiently perform replica measurement, it is desirable to use a recipe to perform the automatic measurement, but since a pattern formed on a wafer is transferred in a mirrored way, the measurement cannot be performed using a wafer measurement recipe. Nonpatent Literature 1 and Patent Literature 1 do not describe how a recipe and a measurement condition should be set for replica measurement. The generation of a semiconductor wafer recipe is mentioned in Patent Literatures 2 and 3, but there is no description about the setting of recipe generation and a measurement condition required in the measurement of a replica which has inverted pattern arrangement or the like.

A pattern evaluation device is proposed below, with which measurement or inspection conditions, supplied for the measurement and inspection of a replica produced by transferring a pattern for a semiconductor wafer or the like, can be easily set, and with which recipes can be easily generated, when measurement and inspection conditions for a semiconductor wafer or the like and a recipe in which these conditions are stored have been prepared in advance.

Solution to Problem

As one embodiment for achieving the above object, there is proposed a pattern evaluation device, in which a pattern formed on a semiconductor wafer is evaluated on the basis of image data or a signal waveform obtained on the basis of beam irradiation or probe scanning of the semiconductor wafter, wherein a device condition for evaluating the semiconductor wafer is converted to a device condition for evaluating a replica obtained by transferring a pattern of a part of the semiconductor wafer, and the converted device condition is used to evaluate the replica.

Advantageous Effect of Invention

According to the above configuration, a device condition for replica evaluation can be generated if there is a device condition for evaluating a semiconductor wafer, so that the device condition for replica measurement can be easily set.

DESCRIPTION OF EMBODIMENTS

Figure 1:
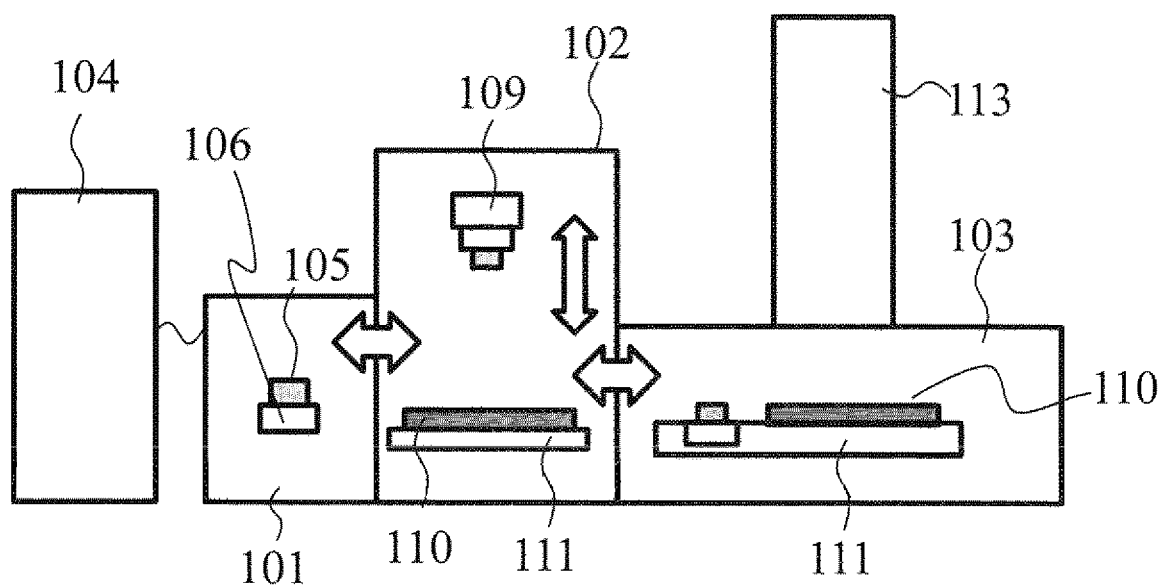
FIG. 1 shows a configuration of a replica collection and replica inspection system.

The following description relates to a pattern evaluation device which evaluates a pattern formed on a replica which transfers a semiconductor pattern. An electron microscope used in measuring or inspecting a semiconductor wafer usually performs automatic measurement and inspection under the control of an operation program called a photographing recipe. Even in a device which measures and inspects a replica, it is required to perform measurement or the like on the basis of the setting of appropriate device conditions, so it is necessary to consider the situation of the replica.

First, the replica transfers the shape of a pattern of a semiconductor device by pressing softened resin against the semiconductor device. Therefore, the pattern formed on a wafer is transferred to the replica in a mirrored way. Meanwhile, a recipe for photographing the semiconductor wafer is generated by using design data which indicates an ideal shape of the pattern and acquired image data of the semiconductor wafer, but there is no design data or the like in the replica which is a mirrored pattern. Therefore, it is necessary to use the design data to be measured or inspected, the image data stored in a photographing recipe of the semiconductor wafer, or information for inverting the image data acquired by measuring or inspecting the semiconductor wafer to set measurement or inspection conditions.

In addition, when the pattern to be measured or inspected is present at an end portion of a resin-coated region configuring the replica, since there are factors which greatly impair the moldability of the replica, such as the unevenness of the end portion in the film thickness of the replica resin or the distortion of the end portion at the time of releasing from the mold, the shape of the pattern to be measured or inspected is deformed, or defects such as pattern collapse or fissure are likely to occur. In a shape measurement which uses an electron microscope where a negative voltage is applied to a sample to control the acceleration voltage, since the electric field becomes unstable, distortion will occur in primary electrons, and measurement accuracy will be decreased.

In consideration of the above conditions, when the replica is acquired, the replica acquisition position is positioned such that the pattern to be measured and inspected is located at the center of the replica. The replica acquisition region acquires the replica in a minimum region of the wafer. In order to facilitate coordinate recalculation, a region which has the same size as a chip centered on the pattern to be inspected so as to include somewhere within four corners (on the upper, lower, left and right sides) of the chip to which the pattern to be inspected belongs is used as the replica acquisition region to acquire the replica. Conditions for measuring or inspecting the replica is acquired on the basis of the inversion of coordinate information, image data, or the like of the target pattern, and the acquired device conditions are used to perform the measurement or inspection of the target pattern on the replica. By performing such processing, the shape of the replica pattern transferred to the resin can be evaluated with high accuracy.

Hereinafter, a device for measuring or inspecting a replica, and a replica collection method for measuring or inspecting the replica will be described with reference to the drawings.

An overall configuration of a replica inspection system is shown in FIG. 1. Here, an example in which an electron beam is used as an inspection probe will be described. The replica inspection system includes an inspection unit 103 which places a semiconductor wafer 110, which is to be a specimen, on a transfer holder 111 provided in a vacuum chamber 103, and uses an electron microscope 113 to perform inspection; a replica resin coating unit 101 for coating replica resin 105 on a replica pad 106 for acquiring the replica from the specimen; a replica acquisition unit 102 which acquires the replica by fixing the replica pad 106 coated with the replica resin 105 to a pad support unit 109, pressing the replica pad 106 against the specimen, and hardening the resin to; and a control unit 104 (an arithmetic processing device) which controls the above units.

Figure 2:
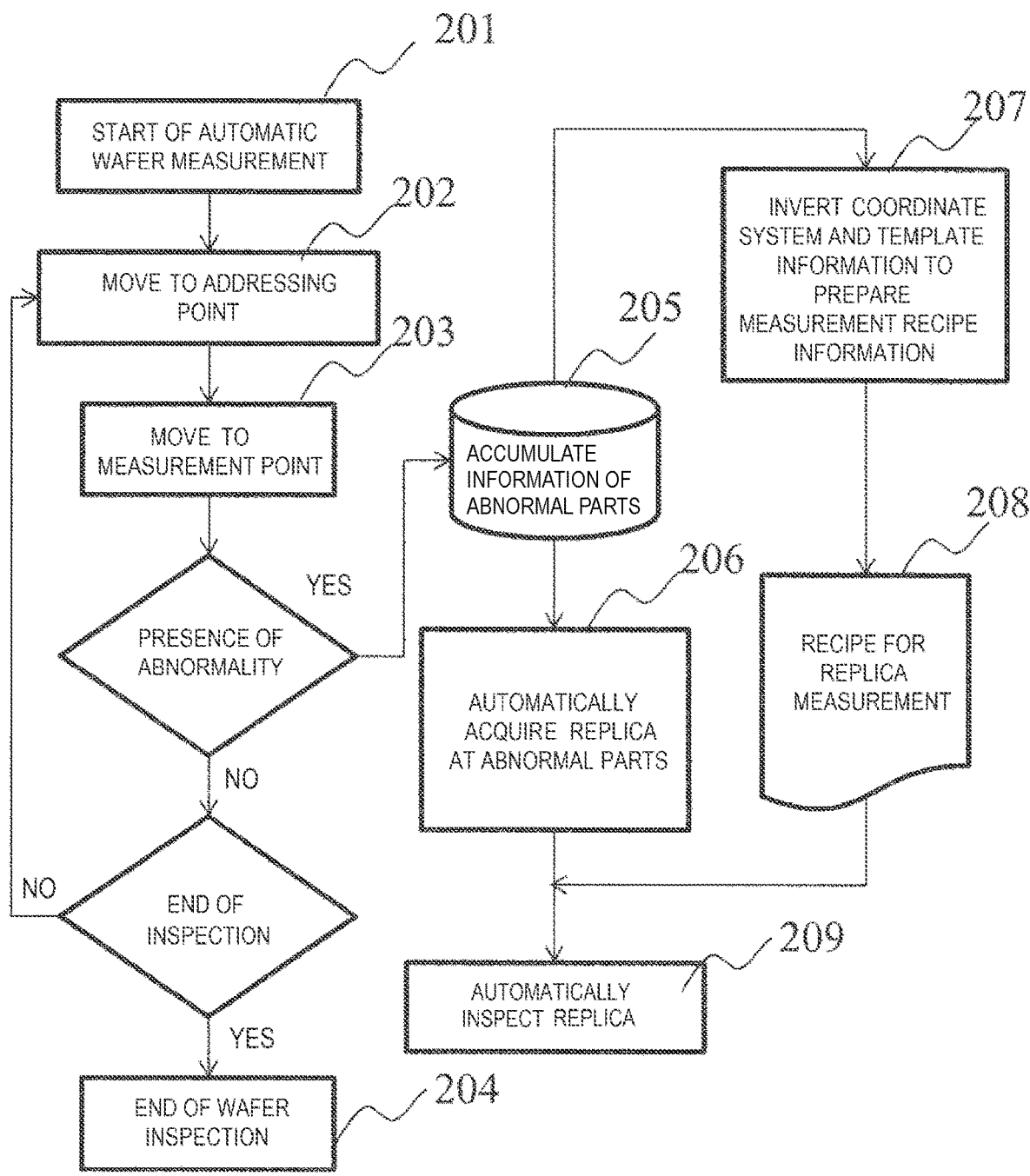
FIG. 2 is a flowchart showing a measurement and inspection process using the replica inspection system.

Next, inspection/measurement (hereinafter referred to as "inspection") process of the semiconductor pattern will be described with reference to FIG. 2. The inspection of the semiconductor pattern is performed according to the procedures of steps 201 to 204 on the basis of an automatic inspection recipe stored in a control system (104 in FIG. 1) in advance. As a result of automatic inspection, a point which exceeds a predetermined abnormal value determination threshold is extracted as an abnormal part (step 205), and information thereof is used for replica acquisition and the replica inspection process. The information used at least includes the chip size of the specimen, the in-shot coordinate of an abnormal point, an image of a precise positioning template, and a relative positional relationship between the acquisition position of the template and an inspection point. The information used may further include an image acquired at the abnormal point and inspection data acquired at the abnormal point.

Figure 3:
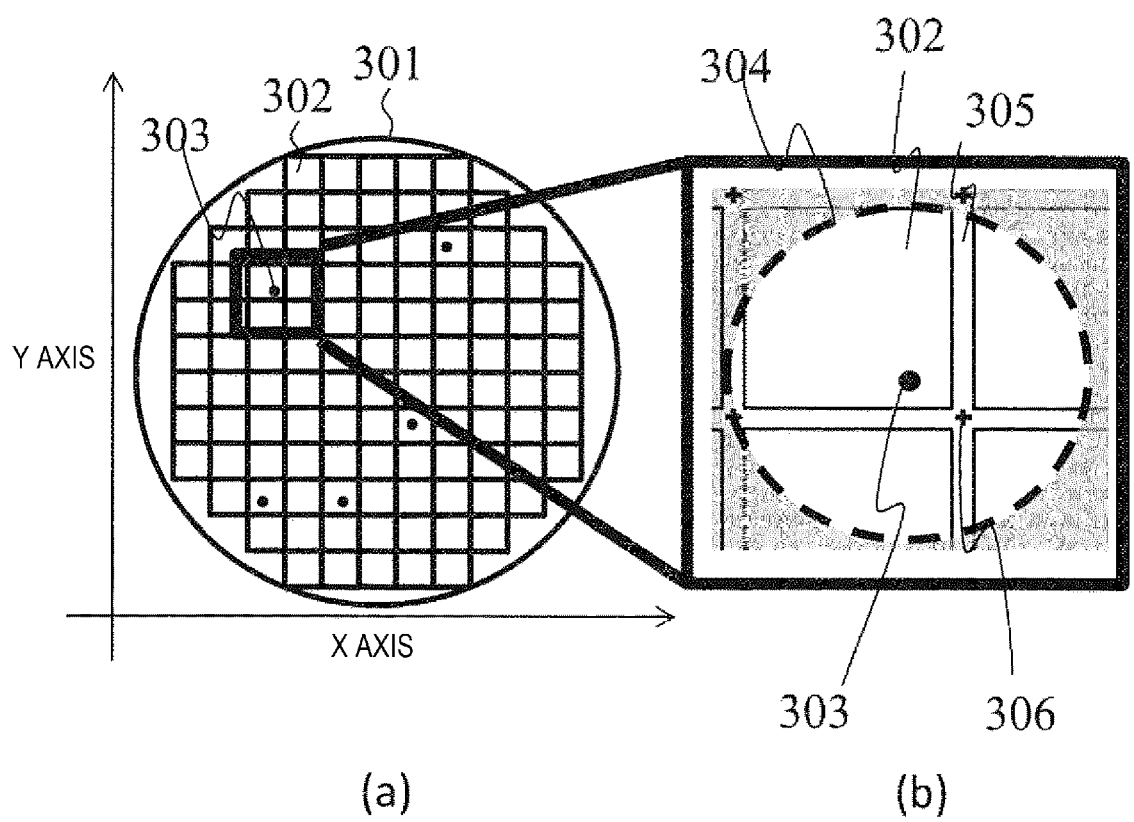
FIG. 3 is a diagram showing an outline of a replica acquisition region of a semiconductor wafer.

Next, a replica acquisition process will be described. FIG. 3A is a diagram showing an example of a semiconductor wafer 301 which is a specimen. A plurality of semiconductor chips 302 are arranged on the semiconductor wafer 301. An inspection point 303 (evaluation point) is extracted as an abnormal point by wafer inspection. In FIG. 3A, five inspection points are extracted.

FIG. 3B is an enlarged view of a region including the inspection point. In the present embodiment, a replica collection region 304 is set such that the inspection point 303 is located at the center of a contact surface between the replica resin 105 and a wafer. The replica collection region 304 is a circular or rectangular region having the same size as a shot (chip) of a light exposure device. The replica of the semiconductor pattern is acquired mainly by the processes of bringing resin into close contact with the pattern to be inspected, hardening the resin, and peeling off the resin, but the shape reproducibility of the pattern shape of the inspection point of the replica differs depending on whether the inspection point is located at the center or at an end portion of a resin region at that time. For example, the film thickness of the resin varies in a plane according to film thickness distribution during coating or pressure distribution when the original template and the replica pad are brought into close contact. In addition, if the distribution of peeling force when the wafer and the replica are released from the mold differs in the resin region, phenomena such as deformation, cracking, or collapse of the pattern shape, which reduce the shape reproducibility of the pattern, are likely to occur, particularly at the end portion of the resin region. In addition, when the dimension of the collected replica is measured, in an electron microscope which controls the acceleration voltage by applying a negative voltage to a sample holder, the electric field becomes non-uniform at the end portion of the replica, and a beam shape is deformed, which makes it difficult to measure the dimension with high accuracy.

Meanwhile, if the inspection point is located at the center of the resin region of the replica, the inspection point is less likely to be affected by a replica acquisition process and is less likely to be affected by the non-uniformity of the electric field at a sample end portion during observation. In addition, since at least one of the four corners of the chip is included in the replica acquisition region by setting the size of the shot to be large, the pattern of at least one of chip origin marks 306 located at the four corners of the chip can be transferred together with one replica.

Next, the generation of an inspection recipe for replica inspection will be described. A replica pattern formed on the replica pad, with respect to the pattern of the semiconductor, is inverted in a left-right direction, and concave and convex portions thereof are also inverted. The inspection recipe (measurement condition setting) is necessary in a case where the replica pattern is inspected automatically. As means for preparing the inspection recipe, the inspection recipe can be newly prepared or prepared in advance and automatically generated on the basis of semiconductor inspection recipe information used at the time of semiconductor pattern inspection.

Figure 4:
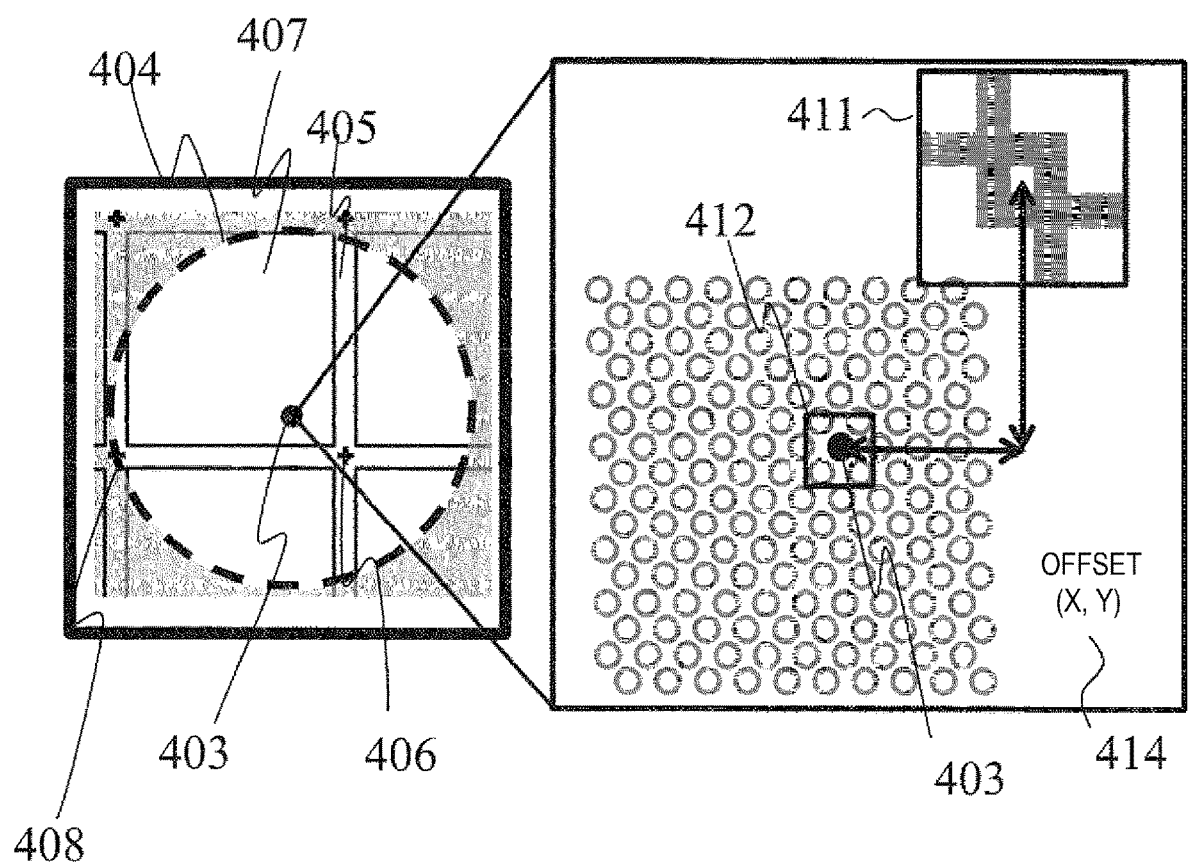
FIG. 4 is a diagram showing a positioning method of an inspection point on the semiconductor wafer.

Hereinafter, an arithmetic processing device, which uses the relative positional relationship between an inspection point transferred to the replica and an origin mark to set device conditions for a measurement device, will be described. FIG. 4 is a diagram illustrating an example of a replica acquisition region on the wafer and a pattern transferred to a replica. In this example, the recipe generation in a case where an inspection point 403 in a chip 407 is inspected using an origin mark 408 at a lower left portion of the chip as a reference (chip coordinates) will be described.

The inspection recipe of the semiconductor pattern (wafer) at least includes in-wafer coordinates of the chip origin position 408, in-chip coordinates using the chip origin 408 of the inspection point 403 as a reference, inspection item information, a template image for template matching which is used for precise positioning (addressing) of the inspection point, and relative position information 414 between an addressing point 414 and the inspection point 403.

In the present example, a case where a recipe for replica inspection is generated using the above information will be described. When recipe information for wafer inspection is converted into the replica inspection recipe, first, it is necessary to generate coordinates of inspection points, but the chip origin 408 is not included in a replica acquisition region 404. Meanwhile, a chip origin 406, which is the closest to the inspection point 403 within the four corners of the chip, is included in the replica acquisition region 404. In a normal wafer inspection, the chip origin 406 will be used to inspect an inspection point included in an adjacent chip. However, for the replica inspection, the chip origin 406 is used as a reference pattern for inspecting a pattern included in the chip 407.

Since chip size (Xc, Yc) is known, coordinates of the origin mark 406 at a lower right corner of the chip can be defined as (Xc, 0). The difference between coordinates (X, Y) of the inspection point 403 and the origin mark 406 can be calculated by (X-Xc, Y-0).

On the basis of the above idea, a coordinate system can be generated on the replica using the new origin mark 406 as a reference on the basis of information used for the wafer inspection, and the position of the inspection point 403 can be specified if the new origin mark 406 can be detected in the replica.

Next, the generation of addressing point information will be described with reference to FIG. 5. A new offset 507 can be obtained by inverting the sign of the X coordinate of the offset 506 for a relative distance between an addressing point 501 which is used for precise positioning of an inspection point 503 on the semiconductor wafer and the inspected point 503.

As for the template for image matching, a template obtained by horizontally inverting an image template 501 used during semiconductor inspection can be used as a template 504. At this time, since the materials of the semiconductor pattern and the replica pattern are different, the contrast is not always coincident. Therefore, it is desirable that the contrast is not included as template information, but matching accuracy can be improved by only extracting edge information from the template image. Further, an inversion template may be prepared from design data or pattern shape information estimated from the design data.

By using the newly prepared coordinate information and the template information as described above, it is possible to automatically generate the recipe for replica inspection, and the procedures from replica preparation to inspection can be performed in one step. It is also possible to reduce unwanted damage of the replica resin pattern by manual observation, and to perform inspection with high accuracy and high speed.

Figure 6:
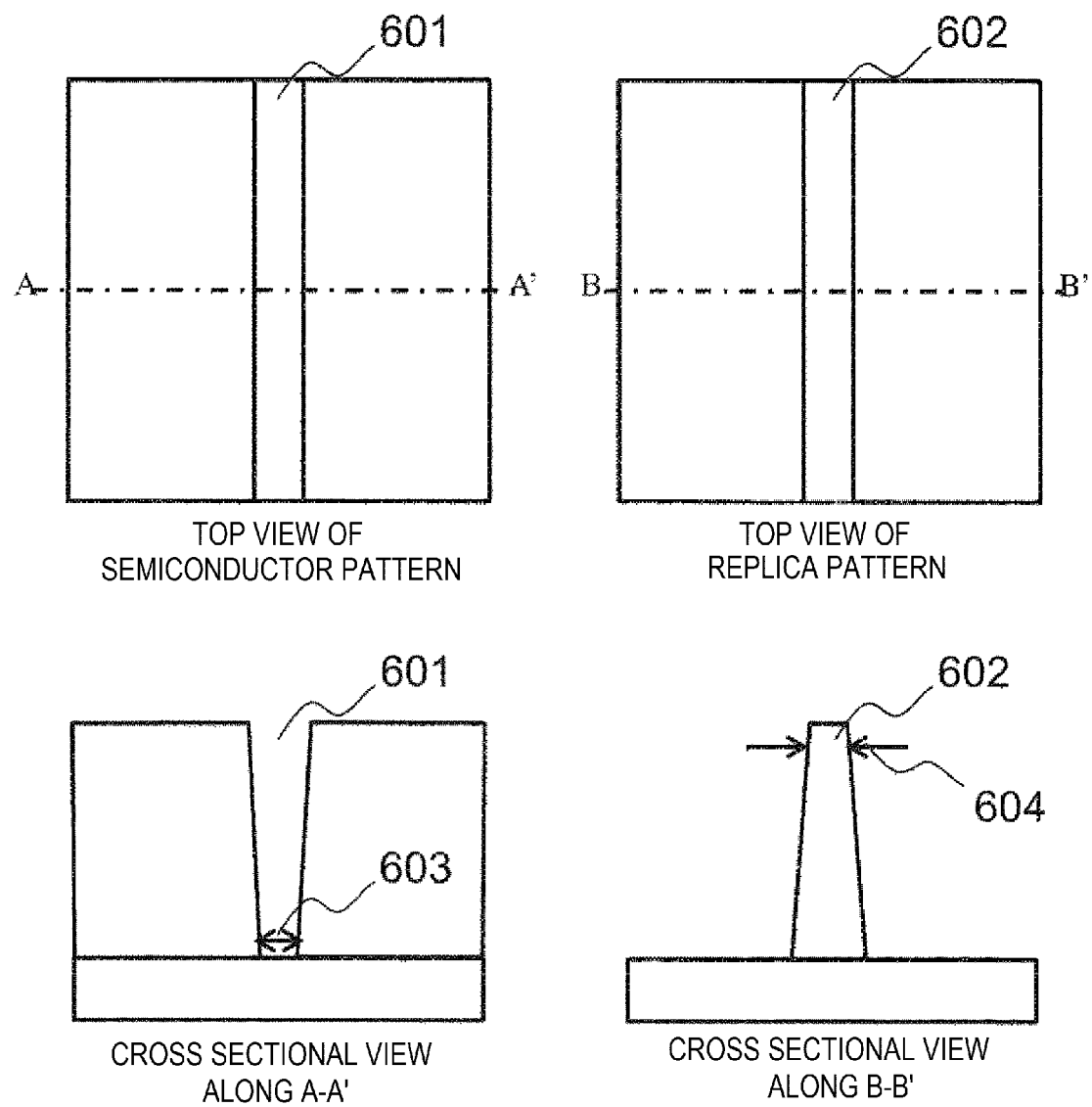
FIG. 6 is a diagram showing an example in which a measurement algorithm for the semiconductor wafer is converted into a measurement algorithm for a replica.

In addition, measurement of the replica pattern can also be automatically generated with reference to a measurement algorithm used for semiconductor pattern measurement. For example, as shown in FIG. 6, a groove pattern 601 on the semiconductor wafer becomes a line pattern 602 on the replica. If an algorithm for measuring a dimension 603 of a bottom of the groove on the semiconductor pattern is set, a line width 604 on a top of the line becomes a target to be measured on the replica. Therefore, the measurement algorithm can be easily changed through inverting concave and convex shapes of the measurement target pattern, inverting the edge search direction and inverting a cursor position in a height direction of the pattern.

The pattern measurement technique disclosed in the present description can be applied to devices for acquiring images or signal waveforms on the basis of beam (probe) scanning, such as an electron microscope or a similar charged particle beam device, and can also be applied to a scanning probe microscope, including an AFM. In addition, in the present embodiment, the replica collection device and the inspection system are described as a composite device, but the replica collection device may exist independently from the inspection system, and the replica may be acquired and provided as a sample to be inspected in another independent inspection system.

Figure 7:
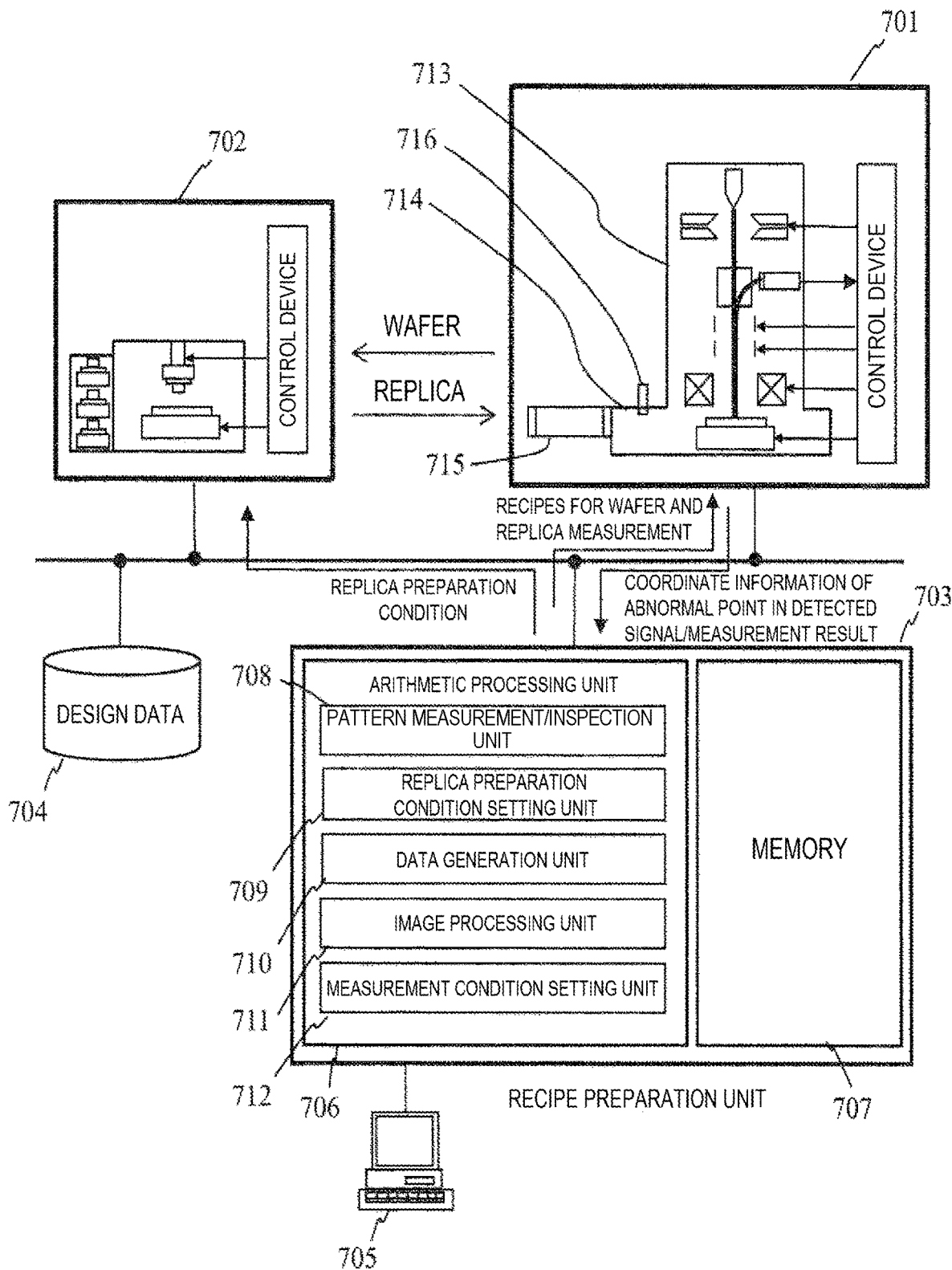
FIG. 7 is a diagram showing an example of a measurement or inspection system including a scanning electron microscope and a replica collection device.

FIG. 7 is a diagram showing an example of a measurement and inspection system which includes a measurement and inspection scanning electron microscope 701, a replica collection device (replica preparation device) 702, and a recipe preparation device 703 which sets device conditions for the scanning electron microscope 701 and the replica collection device 702. The recipe preparation device 703 prepares a recipe which determines measurement conditions for the wafer and the replica in accordance with the flowchart illustrated in FIG. 2. The scanning electron microscope 701 includes an electron beam column 713 which houses an electron source, a scanning deflector which scans an electron beam emitted from the electron source, an objective lens which focuses the electron beam to irradiate a sample, a detector which detects electrons obtained by beam irradiation, or the like; a sample chamber 714 which houses a stage for supporting the wafer or the replica irradiated by the electron beam and keeps sample atmosphere in a vacuum state; and a preliminary exhaust chamber 715 which evacuates the sample atmosphere introduced into the sample chamber 714.

In addition, the sample chamber 714 is mounted with an optical microscope 714 which performs rough alignment by specifying the positions of alignment marks provided on the wafer or the replica.

The scanning electron microscope 701 performs automatic measurement of the wafer under the control of a wafer measurement recipe provided from the recipe preparation device 703. A pattern measurement and inspection unit 708 prepares a luminance profile on the basis of a detection signal output from the scanning electron microscope, and uses the luminance profile to perform pattern measurement. The pattern measurement may also be performed using a processor housed in the scanning electron microscope. At this time, if there is an abnormality in the hole diameter, the line width of the pattern, or the like (for example, if a dimension value error is equal to or higher than a predetermined value based on a designed value), the pattern measurement and inspection unit 708 treats the portion as an abnormal part and stores the coordinate information of the portion in a memory 707 or the like. Since it is possible for the replica to transfer the shape of a deep hole which emits a small amount of secondary electrons, when it is determined that the measurement by the scanning electron microscope is difficult (for example, when it is determined that the luminance of a bottom of a deep hole is equal to or lower than a predetermined value, which makes the measurement difficult), in order to prepare the replica, coordinate information of the portion may be stored.

A replica preparation condition setting unit 709 sets preparation conditions of the replica in the replica collection device 702 on the basis of coordinate information of an inspected portion which is determined to be abnormal or unmeasurable. Specifically, stage control of the replica collection device 702 is performed such that coordinates of the inspected portion determined to be abnormal or unmeasurable are transferred to the center of the replica pad. Identification information of the wafer and the coordinate information of the inspected portion are associated and stored in the memory 707, and the stage control of the replica collection device 702 is performed on the basis of coordinate information corresponding to the identification information of the wafer transferred from the scanning electron microscope.

Figure 8:
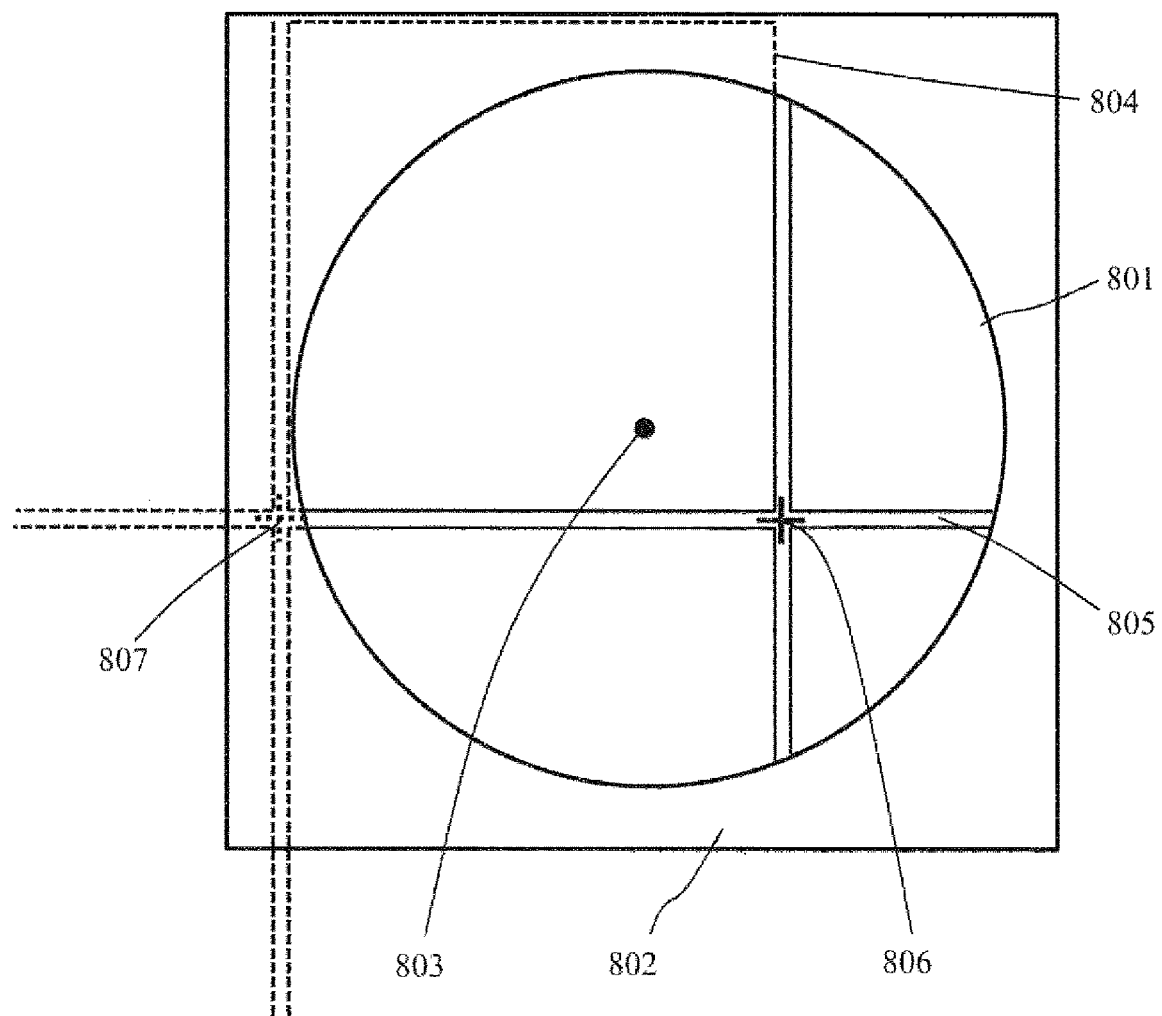
FIG. 8 is a diagram showing an example of replica resin placed on a stage of the scanning electron microscope.

FIG. 8 is a diagram showing an example of replica resin 801 placed on a stage 802 of the scanning electron microscope. A pattern centered at an inspection point 803, which is determined to be abnormal by the pattern measurement and inspection unit 708, is transferred to the replica resin 801. An origin mark 806 which is different from an origin mark 807 at the time of the wafer measurement, and a scribe line 805 are transferred to the replica resin 801. The example of FIG. 8 shows a state in which a portion of a chip 804 is transferred, and a dotted line portion indicates the contour of a chip outside a transfer region of the replica resin 801.

The replica collected by the replica collection device 702 is transferred to the scanning electron microscope again to perform replica measurement. Stage coordinates of the inspection point 803 on the replica stage 802 and the adjacent mark 806 are obtained at a coordinate data generation unit 710 and are registered as recipe information for the measurement. In this example, the inspection point 803 is at the center coordinates of the stage, and the coordinates of the mark 806 are set at a position which is spaced (Xc-X,-Y) apart from the center coordinates of the stage (Xc is the dimension of the chip in the X direction (width), X and Y are the relative distances from the origin mark 807 used in the wafer measurement). The coordinates of the mark 806 are used as stage coordinates during an alignment using an optical microscope 716 which will be described later.

Figure 5:
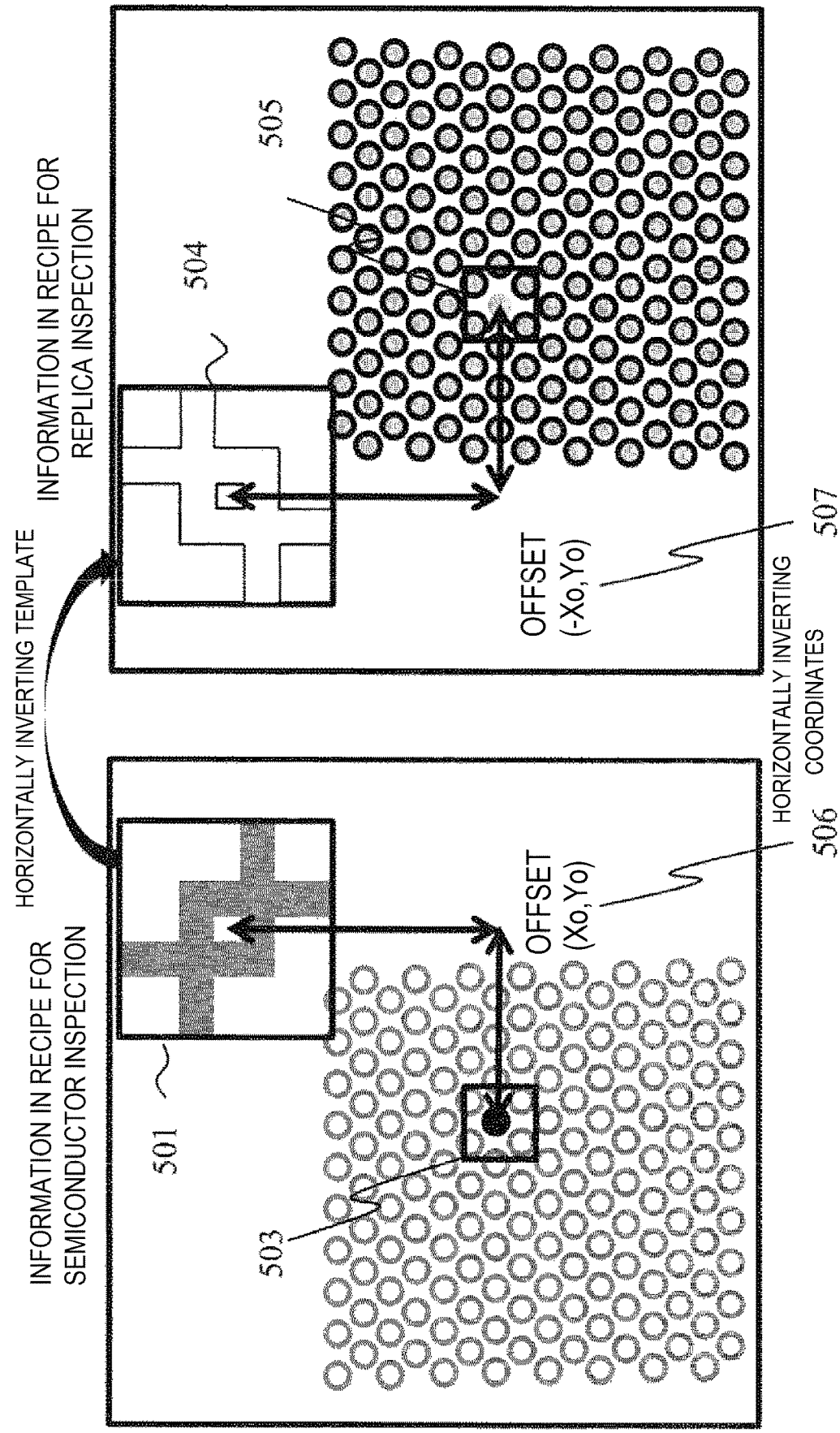
FIG. 5 is a diagram illustrating an example in which a template used in semiconductor wafer measurement is inverted to generate a template for replica measurement.

As illustrated in FIG. 5, an image processing unit 711 inverts a template matching image used for the wafer measurement, and generates the template for the replica measurement. As described above, since the materials of the semiconductor wafer and the replica resin are different, the electron microscope images are also different. Therefore, it is desirable to extract edges only and to use distance information between the edges to perform a matching process. Further, a coefficient for correcting a luminance difference caused by the materials may be prepared in advance, and a pseudo replica image may be generated as the template image by correcting the wafer image.

A measurement condition setting unit 712 generates a recipe for replica measurement on the basis of coordinate information, image information (template), and measurement position information, which are extracted from a recipe for wafer measurement and converted for replica measurement, and stores the generated recipe in the memory 707. As described with reference to FIG. 6, for example, when conditions for measuring the bottom of a groove are set for the recipe for wafer measurement, as for the measurement position information, since the upper portion of a line-shaped pattern of the replica becomes a corresponding position, the upper portion of the line-shaped pattern is set as a measurement target.

The scanning electron microscope 701 performs automatic measurement of the replica according to a recipe generated by the measurement condition setting unit 712. This process will be described below. First, a replica collected from the replica collection device 702 is carried into the scanning electron microscope 701. The collected replica 801 is placed on the stage 802 in the sample chamber 714 of the scanning electron microscope 701 as illustrated in FIG. 8.

After placing the replica 801 on the stage 802, a control device of the scanning electron microscope 701 performs alignment using the optical microscope 716. As described above, the stage is moved such that the position which is spaced (Xc-X,-Y) apart from the center coordinates of the stage 802 is positioned directly below the optical axis of the optical microscope 716. After moving the stage, position specification is performed using the optical microscope 716. If there is no error, the mark 806 will be positioned directly below the optical axis of the optical microscope 716. Actually, however, since there are cases where an error (Xd,Yd) occur, deviation (Xd, Yd) between the center of the visual field of the optical microscope and the mark 806 is specified.

After specifying the deviation (Xd, Yd), in order to position the inspection point 803 within the visual field of the scanning electron microscope 701, the stage 802 is moved by a value obtained by adding the distance between the optical axis of the optical microscope 714 and the optical axis of an electron beam column 713 (d: prescribed value), the distance (Xc-X,-Y) between the mark 806 and the inspection point 803 and the deviation (Xd, Yd).

After moving the stage 802, the control device of the scanning electron microscope 701 uses a template stored in the recipe for replica measurement to perform addressing. As illustrated in FIG. 5, the template used for addressing is an inverted template obtained by inverting a template for wafer measurement, and the position of an addressing pattern in the visual field is specified by using the template to perform addressing (template matching). In the present example, a template for replica measurement is prepared by inverting a template registered in a recipe used for wafer measurement, but the invention is not limited thereto, for example, the template for replica measurement may be prepared by reading design data (layout data) corresponding to the address from a design data storage medium 704 and inverting the layout data on the basis of the address of the addressing pattern of the wafer.

After specifying the position of the addressing pattern, the control device of the scanning electron microscope 701 moves the visual field of the scanning electron microscope 701 by a visual field moving deflector (not shown) or the like, and positions the visual field of the scanning electron microscope 701 at the inspection point 803. The offset amount is set to (-Xo, Yo), which is obtained by inverting the offset amount (Xo, Yo) stored in the wafer measurement recipe.

Since the visual field of the scanning electron microscope is positioned at the inspection point 803 of the replica resin 801 through the processes described above, image data or a signal waveform is obtained on the basis of beam scanning of the inspection point 803. When the obtained image data or signal waveform is used to perform measurement, as described above, since the pattern to be measured is formed with inverted concave and convex portions (for example, if the pattern formed on the wafer is a groove pattern, a line pattern is formed on the replica), when portions which are the same as the portions of the measurement target at the time of measuring the wafer are measured, the level of the threshold for specifying peak positions of the signal waveforms is adjusted, so as to perform dimension measurement for desired positions.

As described above, by appropriately editing the recipe used in the measurement of the semiconductor wafer and setting the recipe and the measurement conditions for replica measurement, it is possible to reduce labor for preparing recipes or the like, and to perform replica measurement efficiently.

REFERENCE SIGN LIST

101: replica resin coating unit
102: replica acquisition unit
103: inspection unit
104: control unit
105: replica resin
106: replica pad
109: replica pad support unit
110: semiconductor wafer
111: transfer holder
113: electron microscope
301: semiconductor wafer
302: chip
303: inspection point
304: replica collection region
305: scribe line
306: origin mark
403: inspection point
404: replica acquisition region
405: scribe line
406: lower right corner of chip to which inspection point belongs
407: chip to which inspection point belongs
408: origin of chip to which inspection point belongs
411: region for inspection point positioning
412: inspection point image acquisition region
414: relative positional relationship information between inspection point and addressing point
501: template acquisition region for addressing during semiconductor inspection
503: inspection point image acquisition region during semiconductor inspection
504: template acquisition region for addressing during replica inspection
505: inspection point image acquisition region during replica inspection
506: relative positional relationship information between inspection point and addressing point during semiconductor inspection
507: relative positional relationship information between inspection point and addressing point during replica inspection
601: concave pattern during semiconductor inspection
602: convex pattern obtained by transferring concave pattern to replica during semiconductor inspection
603: dimension inspection position of bottom of concave pattern
604: dimension inspection position of top of convex pattern

The invention claimed is:

1. A pattern evaluation device, comprising:
an arithmetic processing device which evaluates a pattern formed on a semiconductor wafer on the basis of image data or a signal waveform obtained on the basis of beam irradiation or probe scanning of the semiconductor wafer,
wherein the arithmetic processing device converts a device condition for evaluating a semiconductor wafer to a device condition for evaluating a replica obtained by transferring a part of a pattern of the semiconductor wafer by pressing the replica against the semiconductor wafer, and evaluates the replica using the converted device condition.

2. The pattern evaluation device according to claim 1, wherein, for the device condition for evaluating the semiconductor wafer, the arithmetic processing device converts information of a relative distance between an evaluation point formed on the semiconductor wafer and a first mark, which serves as a reference of coordinates of the evaluation point, into information of a relative distance between a second mark different from the first mark which is transferred to the replica and the evaluation point which is transferred to the replica.

3. The pattern evaluation device according to claim 2, wherein the arithmetic processing device calculates the relative distance information by subtracting a value indicating a position of the evaluation point from a value of a width of a chip on the semiconductor wafer.

4. The pattern evaluation device according to claim 2, wherein the arithmetic processing device selects a mark closest to the position of the evaluation point, and calculates a relative distance between the mark closest to the evaluation point and the evaluation point.

5. The pattern evaluation device according to claim 1, wherein, for the device condition for evaluating the semiconductor wafer, the arithmetic processing device inverts a template matching image for performing determination of a position of a visual field at the evaluation point, and inverts a position specified by the template and the position of the evaluation point.

6. A device condition setting device for a pattern evaluation device which evaluates a pattern formed on a semiconductor wafer on the basis of image data or a signal waveform obtained on the basis of beam irradiation or probe scanning of the semiconductor wafer, the device condition setting device for the pattern evaluation device comprising:
an arithmetic processing device which converts a device condition for evaluating the semiconductor wafer into a device condition for evaluating a replica obtained by transferring a part of the semiconductor wafer by pressing the replica against the semiconductor wafer.

* * * * *